(12) United States Patent
Roy

(10) Patent No.: US 8,988,959 B2
(45) Date of Patent: Mar. 24, 2015

(54) CIRCUIT AND METHOD FOR DYNAMICALLY CHANGING A TRIP POINT IN A SENSING INVERTER

(71) Applicant: LSI Corporation, Milpitas, CA (US)

(72) Inventor: Rajiv Roy, Uttar Pradesh (IN)

(73) Assignee: LSI Corporation, San Jose, CA (US)

( * ) Notice: Subject to any disclaimer, the term of this patent is extended or adjusted under 35 U.S.C. 154(b) by 380 days.

(21) Appl. No.: 13/671,253

(22) Filed: Nov. 7, 2012

(65) Prior Publication Data

US 2014/0126316 A1    May 8, 2014

(51) Int. Cl.
G11C 7/02         (2006.01)
G11C 7/06         (2006.01)

(52) U.S. Cl.
CPC . G11C 7/06 (2013.01); G11C 7/065 (2013.01)
USPC ........ 365/207; 365/189.05; 365/205; 327/51; 327/54; 327/57

(58) Field of Classification Search
CPC .................................. G11C 7/06; G11C 7/065
USPC ............ 365/207, 205, 189.05; 327/51, 54, 57
See application file for complete search history.

(56) References Cited

U.S. PATENT DOCUMENTS

| | | | |
|---|---|---|---|
| 5,237,533 A | | 8/1993 | Papaliolios |
| 5,929,660 A | * | 7/1999 | Dillinger .......................... 327/57 |
| 6,054,879 A | * | 4/2000 | Meng .............................. 327/54 |
| 7,126,834 B1 | * | 10/2006 | Meng et al. ................ 365/49.11 |

* cited by examiner

*Primary Examiner* — Toan Le

(57) ABSTRACT

A circuit and method for dynamically changing trip point voltage in a sensing inverter circuit. In one embodiment, the sensing inverter circuit includes: (1) a base inverter circuit couplable to logic-high and logic-low voltage sources at respective inputs thereof and configured to transition an output thereof from a previous logic-level voltage to a present logic-level voltage based on a logic value of an input voltage received by the base inverter circuit, and (2) a feedback circuit associated with the base inverter circuit and configured to employ the previous logic-level voltage to decouple one of the logic-high and logic-low voltage sources from one of the inputs and thereby shift a trip voltage of the base inverter circuit toward the input voltage.

20 Claims, 2 Drawing Sheets

United States Patent US 8,988,959 B2

CIRCUIT AND METHOD FOR DYNAMICALLY CHANGING A TRIP POINT IN A SENSING INVERTER

TECHNICAL FIELD

This application is directed, in general, to sensing inverters such as sense amplifiers and, more specifically, to a circuit and method for dynamically changing a trip voltage in a sensing inverter.

BACKGROUND

Many digital logic circuits are implemented in complementary metal-oxide-semiconductors (CMOS). CMOS is a design style that uses both p-type and n-type (PMOS and NMOS) metal-oxide-semiconductor field effect transistors (MOSFETs) to create logic circuits used in electronic devices world-wide. CMOS technology is found in microprocessors, microcontrollers, semiconductor memory and many other digital logic integrated circuits (ICs). CMOS integrated circuits may be manufactured in great density and offer high operating speed, energy efficiency and a high degree of noise immunity relative to ICs based on bipolar transistors. For these reasons CMOS is a widely adopted technology in the field of electronic design.

As CMOS technology tends to become smaller, more dense and faster over time, improvements in high-speed processor design have outpaced those of certain semiconductor component integrated circuits, creating a bottleneck with respect to overall integrated circuit speed. One example of the bottleneck is a sense amplifier circuit where voltage transitions create long read and write cycle times, constraining the overall speed of a semiconductor memory integrated circuit. Memory circuits often use differential amplifiers in sense amplifier circuits because they offer certain advantages over sensing inverter circuits. Sensing inverter circuits are intrinsically slower when employing both a rising and falling transition in reading data. Differential amplifiers offer more flexibility, allowing integrated circuit designers to finely tune voltage differentials and power consumption to achieve desirable timing characteristics.

The same is true for many amplifier circuits where time is of the essence, which it almost always is. Single ended sensing amplifiers rely on detectable voltage transitions on an input line to trigger an output voltage. The voltage transitions constitute time delays, and therefore a bottleneck in the overall integrated circuit speed. Differential amplifiers overcome this by employing very small differential voltages to trigger an output voltage. The smaller voltage transitions take less time and speed up the sensing circuit. Improvements in differential amplifier application continue to develop in an effort to relieve the bottleneck in digital logic integrated circuits.

SUMMARY

One aspect provides a sensing inverter circuit. In one embodiment, the circuit includes: (1) a base inverter circuit couplable to logic-high and logic-low voltage sources at respective inputs thereof and configured to transition an output thereof from a previous logic-level voltage to a present logic-level voltage based on a logic value of an input voltage received by the base inverter circuit, and (2) a feedback circuit associated with the base inverter circuit and configured to employ the previous logic-level voltage to decouple one of the logic-high and logic-low voltage sources from one of the inputs and thereby shift a trip voltage of the base inverter circuit toward the input voltage.

Another aspect provides a method for dynamically adjusting a trip point in a sensing inverter circuit. In one embodiment, the method includes: (1) latching a first logic value from the sensing inverter circuit, (2) employing the first logic value in respectively coupling and decoupling first and second rail voltage sources to the sensing inverter circuit, thereby adjusting the trip voltage prior to sensing a second logic value, and (3) latching the second logic value.

Another aspect provides a memory system configured to employ a sensing inverter circuit. In one embodiment, the system includes: (1) an array of memory cells, (2) an addressing circuit configured to activate a memory cell of the array of memory cells and associated with a specified memory address, and (3) a sensing inverter circuit, having: (3a) a base inverter circuit couplable to logic-high and logic-low voltage sources at respective inputs thereof and configured to transition an output thereof from a previous logic-level voltage to a present logic-level voltage based on a logic value of an input voltage received by the base inverter circuit, and (3b) a feedback circuit associated with the base inverter circuit and configured to employ the previous logic-level voltage to decouple one of the logic-high and logic-low voltage sources from one of the inputs and thereby shift a trip voltage of the base inverter circuit toward the input voltage.

BRIEF DESCRIPTION

Reference is now made to the following descriptions taken in conjunction with the accompanying drawings, in which.

DETAILED DESCRIPTION

Figure 1:
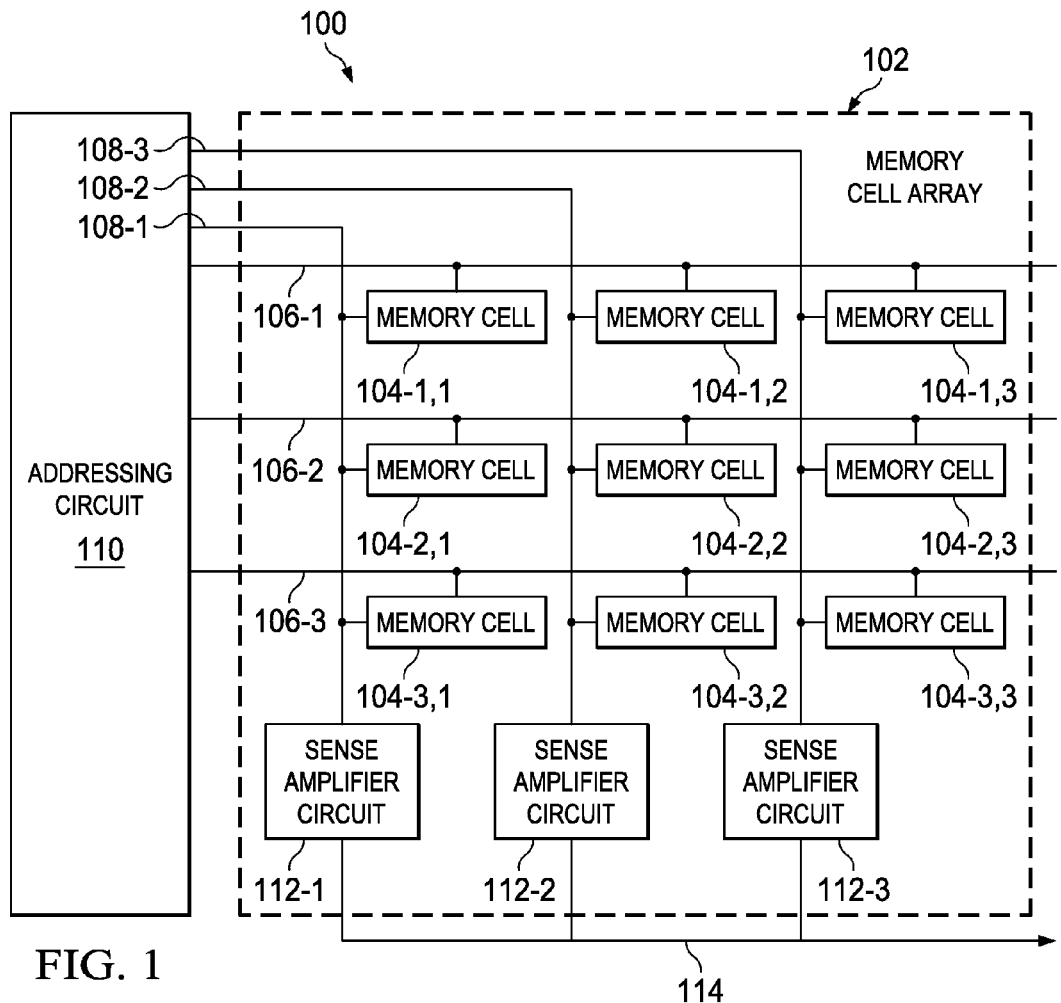
FIG. 1 is a block diagram of one embodiment of a semiconductor memory integrated circuit.

Before describing various embodiments of the circuit or method introduced herein, sensing inversion will be generally described.

One of many CMOS digital logic devices is a sensing inverter. On its face, the function of a sensing inverter in digital logic is to detect a voltage level on an input line that represents a logic value, either a one or zero, logic-high or logic-low. The sensing inverter then transmits an output voltage on an output line that represents the logical opposite of the input logic value. According to the CMOS design style, this is accomplished by some combination of PMOS and NMOS devices. A consequence of the CMOS design style is the inherent time delay in transitioning PMOS and NMOS devices, revealing another function of the sensing inverter: time delay or "buffering." A series of sensing inverters may be employed to create delay circuits within a digital logic integrated circuit.

PMOS and NMOS devices are complimentary. Each is a field-effect transistor (FET) having a gate, a source and a drain terminal. In a PMOS transistor, a low-impedance path exists between the source and drain when a low voltage is applied to the gate. Otherwise, the path is high-impedance. In a NMOS transistor, a low-impedance path exists between the source and drain when a high voltage is applied to the gate. Similar to the PMOS, the path is otherwise high-impedance.

A sensing inverter is implemented when, during a sensing cycle, a logic-low voltage is applied to the input line, a PMOS transistor coupled to a logic-high voltage source conducts from the logic-high voltage source to the output. An NMOS device coupled to a logic-low voltage source does not conduct, as its source-to-drain path is high-impedance. Likewise, when a logic-high voltage is applied to the input line, the NMOS transistor conducts, the PMOS transistor does not, and the output line is driven with a logic-low voltage.

When the sensing inverter input transitions from low-to-high or high-to-low, a time delay occurs as the PMOS and NMOS transistors change states. The length of the time delay is essentially the time required for the gate-to-source voltages to reach an inherent threshold voltage of the PMOS and NMOS transistors.

It is fundamentally realized herein that a previous logic output signal of a previous sensing cycle may be employed to bias the sensing inverter and decrease its response time. More specifically, it is realized herein that a previous logic output signal of a previous sensing cycle may be employed selectively to couple and decouple the logic-high and logic-low voltage sources to reduce the time delay on a present sensing cycle and speeding up the sensing cycle. It is also realized herein the benefit is apparent on consecutive sensing cycles where the previous logic output is logically opposite a present logic input signal to be sensed. In those scenarios, decoupling either the logic-high or logic low voltage source according to the previous logic output value yields a gate-to-source voltage that either rises or falls to the threshold voltage of the sensing inverter device faster than had both voltage sources been coupled. It is further realized herein the time delay of the sensing inverter is less critical when the sensing inverter is not transitioning logic states from one sensing cycle to the next.

It is still further realized herein that decoupling the logic-low voltage source effectively strengthens the pull-up strength of the logic-high voltage source and that decoupling the logic-high voltage source strengthens the pull-down strength of the logic-low voltage source. It is yet further realized herein that these strengthened voltage sources work in tandem with a transitioning input signal to achieve the threshold voltage earlier in the rising or falling of the input signal.

It is also realized herein that implementing the described sensing inverter in semiconductor memory as a sense amplifier yields improved access times. It is further realized herein that the implementation as the sense amplifier in memory integrated circuits reduces the size of the integrated circuit over a differential sense amplifier.

Before describing various embodiments of the circuit or method introduced herein, a memory system within which the circuit may be embodied or the method carried out will be described.

FIG. 1 is a block diagram of one embodiment of a memory system 100 in which one or more aspects of the invention may be implemented. The memory system 100 includes a memory cell array 102 and an addressing circuit 110. The memory cell array 102 is arranged in rows and columns of memory cells 104. The embodiment of FIG. 1 illustrates a three-by-three array of memory cells. Alternative embodiments may use any number of rows and columns of memory cells. The size of an array is dependent on its application and may range from hundreds of memory cells to many millions. For instance, a 64 kilobyte array has 524,288 memory cells. A one gigabyte array has over eight billion memory cells. In the embodiment of FIG. 1, each memory cell 104 in a row is electrically connected to a word-line 106 for the row. For example, in the first row of memory cells 104-1, each memory cell 104-1,1, 104-1,2 and 104-1,3, is electrically connected to word-line 106-1. Furthermore, each memory cell 104 in a column is electrically connected to a bit-line 108 for the column. For example, in the first column of memory cells, 108-1, each memory cell 104-1,1, 104-2,1 and 104-3,1 is electrically connected to bit-line 108-1. In certain embodiments, the bit-line 108 is actually a complimentary pair of bit-lines that provides for use of differential voltages.

In the embodiment of FIG. 1, each bit-line drives a sense amplifier circuit 112. The sense amplifier circuit 112 serves the entire column of memory cells 104 by discriminating low level voltages stored in the memory cells 104 and outputting a CMOS logic level voltage representing a bit to be read from the memory cell array 102.

Access is had to a memory cell 104-$n,m$ via the addressing circuit 110. A read cycle begins by the addressing circuit 110 pre-charging the appropriate word-line 106-$n$ and bit-line 108-$m$ corresponding to the memory cell 104-$n,m$ to be read, thus activating the memory cell 104-$n,m$. The memory cell 104-$n,m$ then charges the bit-line 108-$m$ to reflect a stored logic value, which is then amplified by the sense amplifier circuit 112-$m$. The amplified logic value is output from the memory system 100 on an output line 114.

Having described a memory system within which the circuit may be embodied or the method carried out, various embodiments of the circuit or method will be described.

Figure 2:
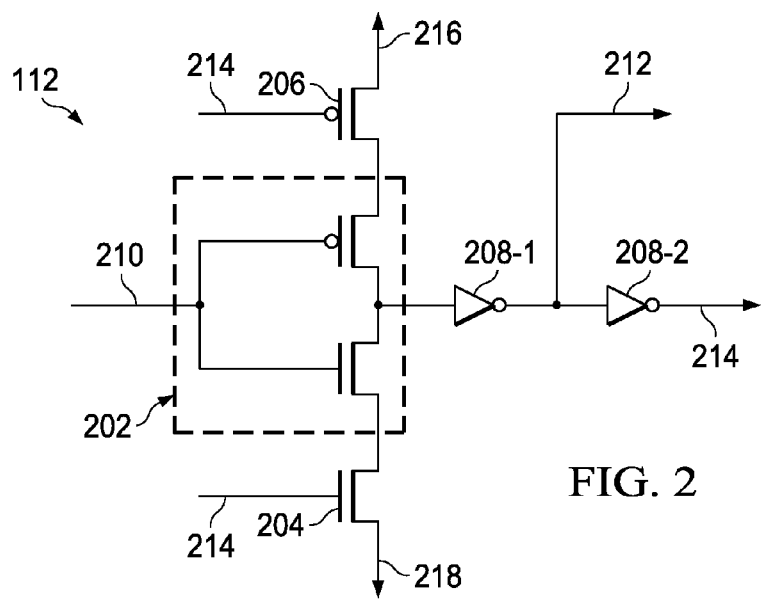
FIG. 2 is a diagram of one embodiment of an improved sensing inverter circuit contained in a sense amplifier circuit.

FIG. 2 is one embodiment of the sense amplifier circuit 112 of FIG. 1 in which one or more aspects of the invention may be implemented. The sense amplifier circuit 112 includes a base inverter circuit 202. The base inverter circuit 202 has an input stage configured to receive an input signal 210 representing a bit stored in a memory cell. The base inverter circuit 202 also includes an output stage configured to transmit an output signal through a first and second inverter 208-1 and 208-2. The output stage is operable to generate an amplified output 212 and a feedback signal 214.

A PMOS 206 and a NMOS 204 respectively couple the base inverter circuit 202 to a logic-high rail 216 and a logic-low rail 218. The PMOS 206 and NMOS 204 are operable to couple and decouple the base inverter circuit 202 according to the feedback signal 214. In other embodiments, the logic-high rail 216 and logic-low rail 218 are couplable when the memory cell is activated by a word-line or a column select signal.

The sense amplifier circuit 112 is configured such that when the feedback signal 214 is high (indicating a previously read out bit being a zero) and the input signal 210 is high (indicating a present bit to be read being a one), the sense amplifier circuit 112 needs to transition from a logic-low state to a logic-high state. The logic-high rail 216 is decoupled by the PMOS 206, the PMOS 206 being held open by the feedback signal 214. The PMOS of the base inverter circuit 202 is thereby disabled. The logic-low rail 218 is coupled by the NMOS 204, the NMOS 204 being held closed by the feedback signal 214. The NMOS of the base inverter circuit 202 is thereby enabled. The sense amplifier circuit 112 is then operable to sense the input signal 210 and transmit an output logic value of one as the amplified output 212.

Conversely, when the feedback signal 214 is low (indicating a previously read out bit being a one) and the input signal 210 is low (indicating a present bit to be read being a zero), the sense amplifier circuit 112 needs to transition from a logic-high state to a logic-low state. The sense amplifier circuit 112 is further operable to couple the logic-high rail 216, decouple the logic-low rail 218, and transmit an amplified output 212 representing a logic value of zero.

Figure 3:
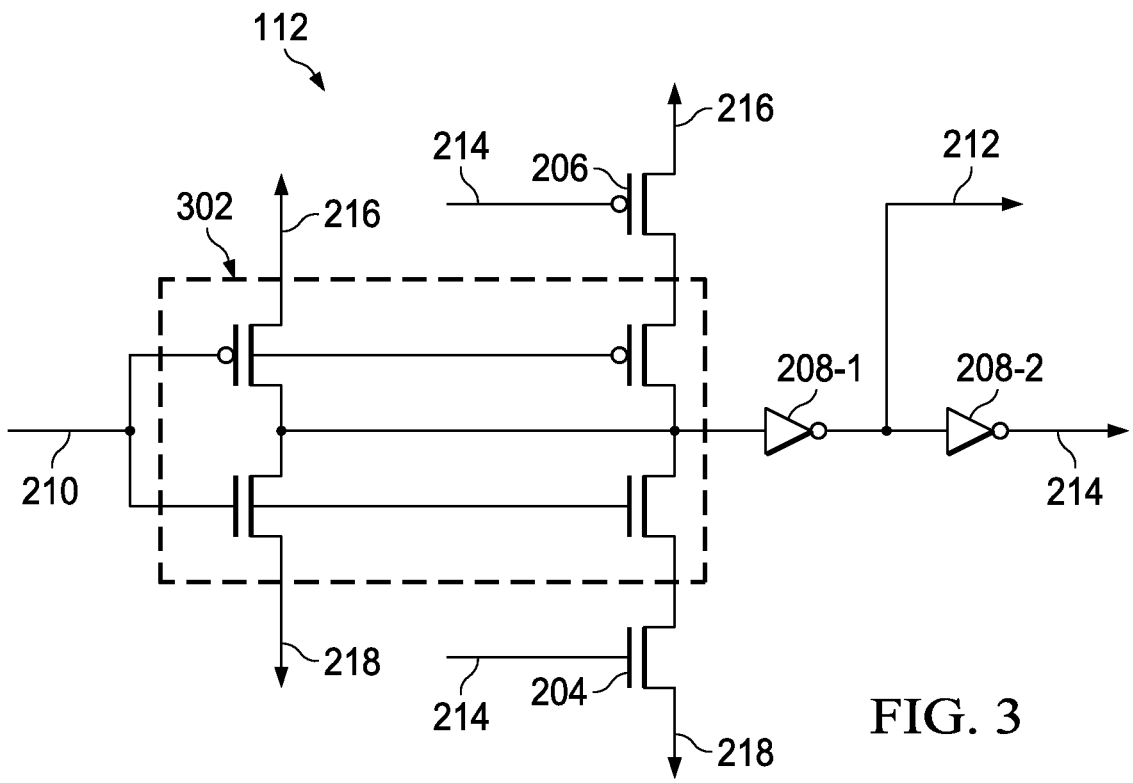
FIG. 3 is a diagram of another embodiment of an improved sensing inverter circuit contained in a sense amplifier circuit.

FIG. 3 is a second embodiment of the sense amplifier circuit 112 of FIG. 1 in which one or more aspects of the invention may be implemented. The circuit of FIG. 3 is functionally equivalent to that of FIG. 2. However, the circuit of FIG. 3 employs a base inverter circuit 302 having a redundant inverter stage in parallel with a primary stage also present in the circuit of FIG. 2. The redundant parallel stage of the base inverter circuit 302 is directly couplable to the logic-high rail 216 and the logic-low rail 218.

Figure 4:
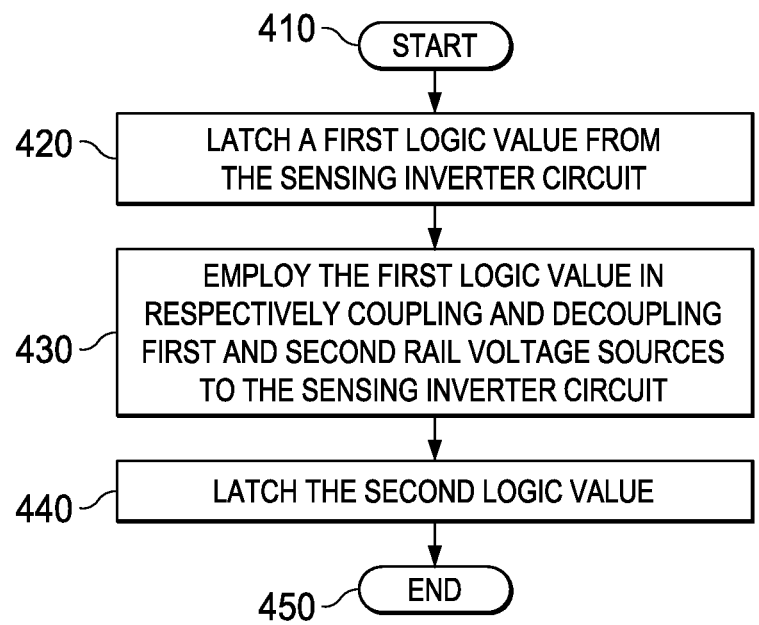
FIG. 4 is a flow diagram of a method of dynamically changing a trip voltage in a sensing inverter circuit.

FIG. 4 is a method for dynamically changing a trip voltage in a sensing inverter circuit. The method begins at a step 410. A first logic value is latched from the sensing inverter circuit at step 420. The first logic value is then employed at step 430 to couple a first rail voltage source to the sensing inverter circuit, partially enabling the circuit, and to decouple a second rail voltage source, partially disabling the circuit. The trip voltage of the sensing inverter circuit is thereby adjusted, ready for a second logic value to be read. The second logic value is then latched at step 440. The method ends at step 450. In certain embodiments, the second logic value is logically opposite the first.

In alternate embodiments, the first rail voltage source and second rail voltage source are embodied as a pair of voltage sources: logic-high and logic-low voltage sources. In other embodiments the first rail voltage source and second rail voltage source are coupled and decoupled by PMOS and NMOS transistors. In certain embodiments, the logic-high voltage source is coupled to the sensing inverter circuit when the first logic value is high, and the logic-low voltage source is decoupled. A pull-up effect of the logic-high voltage source is strengthened by the decoupling, thereby shifting the trip voltage of the sensing inverter circuit up toward the logic-high voltage source level. Likewise, the logic-low voltage source is coupled when the first logic value is low, the logic-high voltage source is decoupled, and the trip voltage shifted down toward the logic-low voltage source level.

In certain embodiments, the first logic value and second logic value represent bits of data stored in a memory cell array and read out in consecutive read cycles from the memory. In some of those embodiments, the sensing inverter circuit is only operable while an associated column of the memory cell array is active, as indicated by a word-line or column select signal.

Those skilled in the art to which this application relates will appreciate that other and further additions, deletions, substitutions and modifications may be made to the described embodiments.

What is claimed is:

1. A sensing inverter circuit, comprising:
    a base inverter circuit couplable to logic-high and logic-low voltage sources at respective inputs thereof and configured to transition an output thereof from a previous logic-level voltage to a present logic-level voltage based on a logic value of an input voltage received by said base inverter circuit; and
    a feedback circuit associated with said base inverter circuit and configured to employ said previous logic-level voltage to decouple one of said logic-high and logic-low voltage sources from one of said inputs and thereby shift a trip voltage of said base inverter circuit toward said input voltage.

2. The sensing inverter circuit as recited in claim 1 wherein said present logic-level voltage represents a logic value stored in a memory cell.

3. The sensing inverter circuit as recited in claim 2 wherein said logic-high and logic-low voltage sources are couplable when said memory cell is active.

4. The sensing inverter circuit as recited in claim 1 wherein said base inverter circuit comprises series coupled PMOS and NMOS transistors, said transistors having:
    source terminals coupled respectively to said logic-high and logic-low voltage sources,
    respective gate terminals coupled to a common input line, and
    respective drain terminals coupled to a common output line.

5. The sensing inverter circuit as recited in claim 1 wherein said feedback circuit comprises an NMOS and PMOS transistor isolating said base inverter circuit from said logic-low and logic-high voltage sources respectively.

6. The sensing inverter circuit as recited in claim 5 wherein said previous logic-level voltage is applied at the gate terminals of said NMOS and PMOS transistors.

7. The sensing inverter circuit as recited in claim 1 wherein said present logic-level voltage is logically opposite of said previous logic-level voltage.

8. A method of adjusting a trip voltage in a sensing inverter circuit, comprising:
    latching a first logic value from said sensing inverter circuit;
    employing said first logic value in respectively coupling and decoupling first and second rail voltage sources to said sensing inverter circuit, thereby adjusting said trip voltage prior to sensing a second logic value; and
    latching said second logic value.

9. The method as recited in claim 8 wherein said employing further comprises driving a PMOS transistor and a NMOS transistor for carrying out said coupling and decoupling.

10. The method as recited in claim 8 wherein said first and second rail voltage sources are a logic-high voltage source and a logic-low voltage source respectively.

11. The method as recited in claim 10 wherein said logic-high voltage source is coupled when said first logic value is high.

12. The method as recited in claim 8 wherein said first logic value and said second logic value represent consecutive data-reads from a column of a memory cell array.

13. The method as recited in claim 12 wherein said sensing inverter circuit is operable when said column is active.

14. The method as recited in claim 8 wherein said second logic value is logically opposite said first logic value.

15. A memory system configured to employ a sensing inverter circuit, comprising:
    an array of memory cells;
    an addressing circuit configured to activate a memory cell of said array of memory cells and associated with a specified memory address; and
    a sensing inverter circuit, including:
        a base inverter circuit couplable to logic-high and logic-low voltage sources at respective inputs thereof and configured to transition an output thereof from a previous logic-level voltage to a present logic-level voltage based on a logic value of an input voltage received by said base inverter circuit; and
        a feedback circuit associated with said base inverter circuit and configured to employ said previous logic-level voltage to decouple one of said logic-high and logic-low voltage sources from one of said inputs and thereby shift a trip voltage of said base inverter circuit toward said input voltage.

16. The memory system as recited in claim 15 wherein said memory cell is coupled to an input terminal of said base inverter circuit via a bit-line.

17. The memory system as recited in claim 15 wherein said base inverter circuit comprises series coupled PMOS and NMOS transistors, said transistors having:
   source terminals coupled respectively to said logic-high and logic-low voltage sources,
   respective gate terminals coupled to a common input line, and
   respective drain terminals coupled to a common output line.

18. The memory system as recited in claim 15 wherein said feedback circuit comprises an NMOS and PMOS transistor isolating said base inverter circuit from said logic-low and logic-high voltage sources respectively.

19. The memory system as recited in claim 15 wherein said previous logic-level voltage is applied to the gate terminals of said NMOS and PMOS transistors.

20. The memory system as recited in claim 15 wherein said present logic-level is logically opposite of said previous logic-level voltage.

* * * * *